United States Patent [19]
Gillberg et al.

[11] Patent Number: 6,055,149
[45] Date of Patent: Apr. 25, 2000

[54] CURRENT LIMITED, THERMALLY PROTECTED, POWER DEVICE

[75] Inventors: James E. Gillberg; Raymond L. Giordano, both of Flemington, N.J.

[73] Assignee: Intersil Corporation, Palm Bay, Fla.

[21] Appl. No.: 09/203,700

[22] Filed: Dec. 2, 1998

[51] Int. Cl.[7] .................................................. H02H 5/00
[52] U.S. Cl. ........................ 361/103; 361/93.1; 361/98; 361/115
[58] Field of Search ........................... 361/103, 98, 90, 361/115, 93.1, 18

[56] References Cited

U.S. PATENT DOCUMENTS

| | | | |
|---|---|---|---|
| 3,796,943 | 3/1974 | Nelson et al. | 323/9 |
| 4,355,344 | 10/1982 | Felici et al. | 361/103 |
| 4,360,852 | 11/1982 | Gilmore | 361/98 |
| 4,672,302 | 6/1987 | DeShazo, Jr. et al. | 323/277 |
| 4,698,655 | 10/1987 | Schultz | 357/23.4 |
| 4,750,079 | 6/1988 | Fay et al. | 361/101 |
| 4,787,007 | 11/1988 | Matsumura et al. | 361/98 |
| 4,896,245 | 1/1990 | Qualich | 61/103 |
| 4,903,106 | 2/1990 | Fukunaga et al. | 357/43 |
| 5,008,771 | 4/1991 | Palara | 361/103 |
| 5,272,392 | 12/1993 | Wong et al. | 307/270 |
| 5,434,443 | 7/1995 | Kelly et al. | 257/467 |
| 5,483,102 | 1/1996 | Neal et al. | 257/712 |
| 5,497,285 | 3/1996 | Nadd | 361/103 |
| 5,543,996 | 8/1996 | Nakago | 361/90 |
| 5,568,347 | 10/1996 | Shirai et al. | 361/98 |
| 5,642,252 | 6/1997 | Sakamoto et al. | 361/93 |
| 5,737,170 | 4/1998 | Moyer | 361/103 |

Primary Examiner—Stephen W. Jackson
Attorney, Agent, or Firm—Allen, Dyer, Doppelt, Milbrath & Gilchrist, P.A.

[57] ABSTRACT

A thermally protected power device is disclosed and includes a semiconductor package having at least five pins. One of the pins comprises a ground pin for connecting to a ground connection, and another one of the five pins comprises a power pin for connecting to a source of a temperature stable reference voltage. A field effect transistor is formed within the semiconductor package and has a source, drain and gate connected to three of the output pins and forms respective source, drain and gate pins. A parasitic bipolar transistor is formed within the package and has a base, collector and emitter. The collector is connected to the gate of the field effect transistor. A voltage divider circuit is formed within the semiconductor package and connected to the power pin, the ground pin and the base of the thermal limiting bipolar transistor for receiving a temperature stable reference voltage obtained from a temperature stable voltage source connected to the power pin, and dividing the voltage down close to the Vbe of the thermal limiting bipolar transistor. As the temperature rises within the semiconductor package, the Vbe of the thermal limiting bipolar transistor drops and switches on to pull gate voltage down and limit current passing through the field effect transistor.

32 Claims, 2 Drawing Sheets

CURRENT LIMITED, THERMALLY PROTECTED, POWER DEVICE

FIELD OF THE INVENTION

This invention relates to the field of thermally protected power devices using a field effect transistor, and more particularly, this invention relates to a thermally protected power device also having a current limiting device that drops the gate voltage as current and temperature are increased through the field effect transistor.

BACKGROUND OF THE INVENTION

Field effect transistors (FET) are used in many applications, particularly in power switches because of their robust ability to withstand current and fast switching speeds. Depending on the design of the field effect transistors, they can be used on the high side or the low side of many circuits in automobiles and other similar applications. More and more manufacturers are producing smart field effect transistors that are current limited and thermally protected. These various types of smart field effect transistors are designed to protect the power switch in case of a short circuit so that it will not overheat and over dissipate.

One example of a field effect transistor or other types of power device that is protected against destructive current surges, such as an electrical short, include the circuit disclosed in U.S. Pat. No. 4,355,344 to Felici et al. Ancillary transistors are formed in a semiconductor body and act as a parasitic transistor. In this complicated circuit, an external circuit includes a driver stage (DR) and a comparator (COMP) having as one input a reference voltage. The magnitude of the reference voltage is chosen, such that the comparator emits an inhibit signal only when the transistor T2 has undergone excessive heating, such as when the detected emitter voltage $V_E$ rises to a value indicating excessive heating of transistor T2. This signal then causes the driver stage DR to reduce the conduction of transistor T2 to a safe level.

U.S. Pat. No. 4,903,106 to Fukunaga et al. discloses another power device having a temperature detecting device formed on the same substrate to form a monolithic device. Two reference voltages are applied from a source to the base terminal of the bipolar transistor and through an error amplifier and driver to the gate of a field effect transistor. The reference voltage is applied to the base terminal of the transistor. Each collector terminal is connected to a power supply $V_{CC}$ through a resistor. The base-to-emitter voltage drop is lowered as the temperature is increased. A voltage value corresponding to an abnormal detecting temperature of the power device is supplied to the base terminal as a reference voltage because of the temperature dependency of the transistor.

Other prior art circuits include a bandgap reference that is formed on a semiconductor substrate, together with a field effect transistor and a parasitic bipolar transistor to form one monolithic device. The parasitic transistor and field effect transistor are manufactured by techniques known to those skilled in the art. However, the bandgap reference that is formed monolithically on one chip with other components adds to the expense and complexity of manufacturing the power devices, even though this smart field effect transistor circuit is simple in design with a parasitic bipolar transistor that turns on and initiates some type of thermal limiting.

SUMMARY OF THE INVENTION

It is therefore an object of the present invention to provide a simplified design of a thermally protected power device using a field effect transistor formed monolithically on the same semiconductor substrate to form one chip that does not include a bandgap reference formed monolithically on the chip.

It is still another object of the present invention to provide a thermally protected power device using a monolithically formed field effect transistor and thermal limiting bipolar transistor that uses an external temperature stable voltage source.

The present invention is advantageous because it now allows low cost and simplified overcurrent and thermal protection of a power device, such as a power device using a field effect transistor, that is necessary for many applications, such as in the automobile industry. Simplified process technology as known to those skilled in the art can be used to manufacture the power device of the present invention, instead of complex process technologies that require the monolithic manufacture of a bandgap reference on the same chip as a field effect transistor or other device. Thus, the use of simple power technologies can be used while achieving temperature and overcurrent protection. The present invention can be used in many of the power devices manufactured by Harris Corporation of Melbourne, Fla.

In accordance with the present invention, a thermally protected power devices includes a semiconductor substrate. A field effect transistor is formed on the semiconductor substrate and has a source, drain and gate. A voltage dropping resistor is formed on the semiconductor substrate and connected to the gate of the field effect transistor. A thermal limiting bipolar transistor is formed on the semiconductor substrate and has a base, collector and emitter. The collector is connected to the voltage dropping resistor and gate of the field effect transistor.

A voltage divider circuit is formed on the semiconductor substrate and has an output connected to the base of the thermal limiting bipolar transistor. A voltage divider circuit receives a temperature stable reference voltage from a temperature stable voltage source external to the semiconductor substrate and divides the voltage down. As the temperature rises within the semiconductor substrate, the Vbe of the voltage dropping bipolar transistor drops and switches on to pull the gate voltage down to limit the current through the field effect transistor.

In accordance with one aspect of the present invention, the thermal limiting bipolar transistor switches on and drops voltage across the voltage dropping resistor. The voltage divider circuit preferably comprises two resistors in series having a voltage divider output. In still another aspect of the present invention, the thermally protected power device also comprises a current sampling resistor connected to the source of the field effect transistor and a current limiting bipolar transistor having a base and emitter connected to the current sampling resistor and a collector connected to the gate of the field effect transistor. The voltage divider circuit also further comprises a protection diode connected in parallel with the two resistors. The temperature stable reference is preferably about five volts, and in still another aspect of the invention, can be about three volts.

In still another aspect of the present invention, the thermally protected power device can comprise a semiconductor package having five pins. One of the pins comprises a ground pin for connecting to a ground connection and another one of the five pins comprises a power pin for connecting to a source of a temperature stable reference voltage.

In this particular aspect of the present invention, a field effect transistor is formed within the semiconductor package and has a source, drain and gate connected to three of the pins and forming a respective source, drain and gate pins. A voltage dropping resistor is formed within the semiconductor package and connected to the gate of the field effect transistor. A thermal limiting bipolar transistor is formed within the semiconductor package and has a base, collector and emitter. The collector is connected to the voltage dropping resistor and gate of the field effect transistor.

A voltage divider circuit is formed within the semiconductor package connected to the power pin, the ground pin and the base of the thermal limiting transistor for receiving a temperature stable reference voltage received from a temperature stable voltage source connected to the power pin and dividing the voltage down close to the Vbe of the thermal limiting bipolar transistor. As the temperature rises within the semiconductor package, the Vbe of the bipolar transistor drops and switches on to pull the gate voltage down and limit the current passing through the field effect transistor.

In still another aspect of the present invention, a method of protecting a power switch from overcurrent conditions comprises the steps of forming a field effect transistor on a semiconductor substrate, having a source, drain and gate. A thermal limiting bipolar transistor is formed on the substrate and has a base, collector and emitter. This bipolar transistor is formed such that the collector is connected to the gate of the field effect transistor to sample voltage therethrough. A voltage divider is formed on the semiconductor substrate and has an output connected to the base of the thermal limiting bipolar transistor. An external temperature stable reference is supplied to the voltage divider circuit, which is divided down such that when the temperature rises within the semiconductor substrate, the Vbe of the parasitic bipolar transistor drops and switches onto drop gate voltage and limit current passing through the field effect transistor.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous because it now provides the ability to add protection to a power device, such as with a field effect transistor, that is key for many systems, such as used in the automobile industry and other industries. Historically, the prior art used complex process technologies to form a bandgap reference monolithically on one semiconductor substrate, making one chip for the power device. The present invention now allows the use of simple power technologies, while achieving temperature and overcurrent protection. The present invention can be used in smart field effect transistor power devices and MOSFET and insulated gate bipolar transistors (IGBT), such as known to those skilled in the art. Because of its simplicity and design, semiconductor manufacturing is simplified as known to those skilled in the art. In prior art devices, the internal bandgap reference that is monolithically formed with a field effect transistor and sometimes one or more parasitic transistors, would often be driven off an unregulated or regulated supply.

The present invention now supplies a thermally limited field effect transistor. An external, thermally stable, external voltage is used to control a thermally protected bipolar transistor which, in one aspect of the present invention, is an NPN bipolar transistor, to pull the gate voltage down as temperature is increased. The semiconductor package holds the semiconductor substrate, which includes the field effect transistor and other components. An example of a package is a standard five leaded package such as sold by Harris Corporation of Melbourne, Fla. under the tradename designation T0220. If the thermally protected bipolar transistor is formed to tolerate high voltages, the thermal shut down could work for either a low side or high side configuration, as known by those skilled in the art as used in automobile applications.

Figure 1:
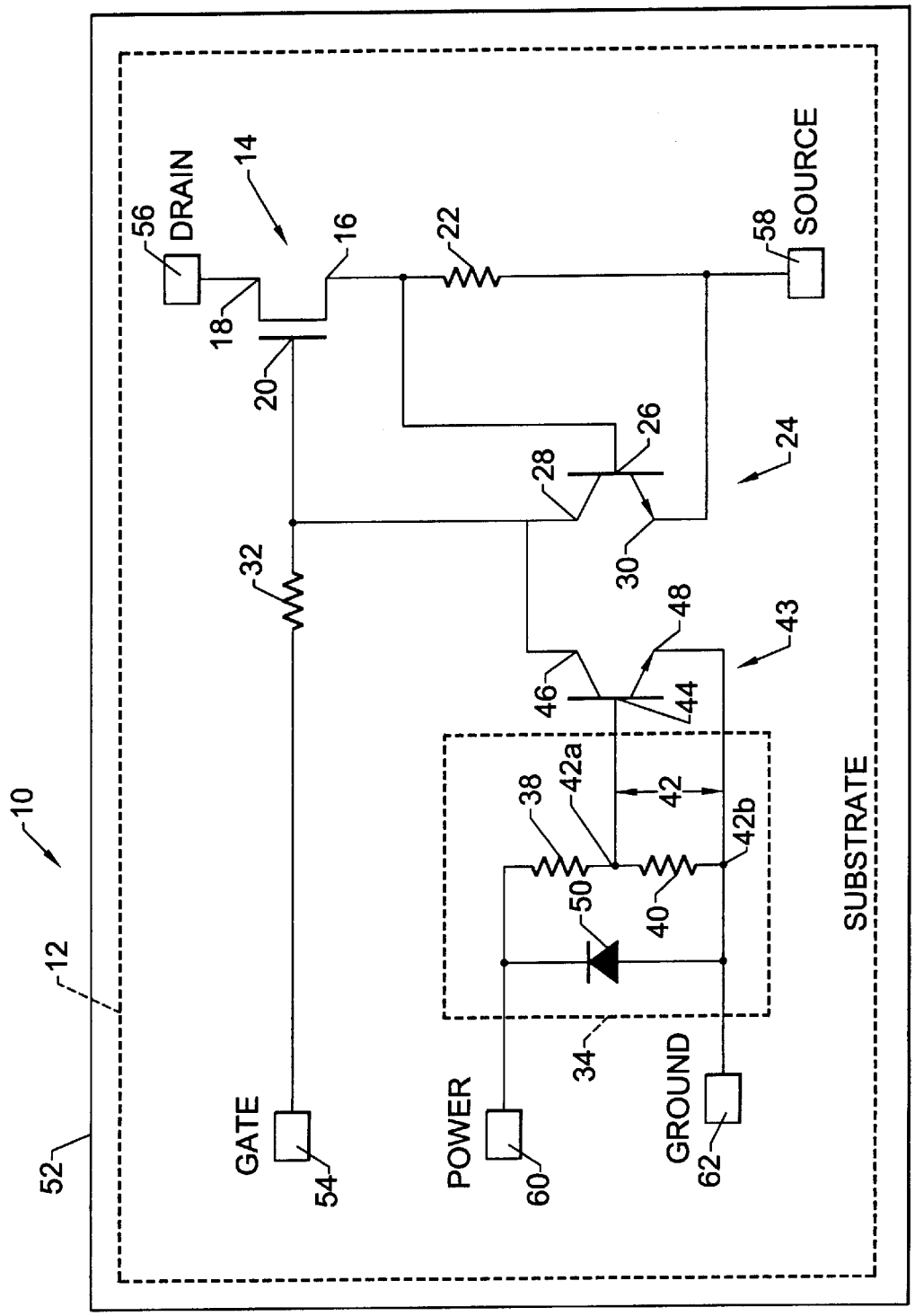
FIG. 1 is a schematic circuit diagram of a thermally protected power device in accordance with one aspect of the present invention, and showing the basic elements of the circuit formed monolithically, the five pins used in one aspect of the invention, and the semiconductor substrate as indicated by the dotted lines.

Referring now to FIG. 1, there is shown the current limited, and thermally protected power device of the present invention at 10 and the semiconductor substrate that is outlined by the dotted line at 12. The semiconductor substrate 12 is formed from standard materials used in semiconductor manufacturing and especially the manufacture of field effect transistor power devices, as known to those skilled in the art. A field effect transistor is indicated generally at 14, and is formed on the semiconductor substrate 12 and includes a source 16, drain 18 and gate 20. The field effect transistor 14 is formed by standard semiconductor device manufacturing techniques known to those skilled in the art, and includes the deposition techniques and doping techniques that are commonly used in semiconductor manufacturing.

A current sampling resistor 22 is also formed on the semiconductor substrate 12 and connected to the source 16 of the field effect transistor 14. This current sampling or "sensing" resistor 22 acts as a resistive current and voltage sense of the field effect transistor 14 and is shown directly connected to the source 16. However, the current sampling resistor 22 could be piloted, as known to those skilled in the art. The current sampling resistor 22 can be formed as well known to those skilled in the art by manufacturing low doped poly regions.

A current limiting transistor 24, which is preferably formed as an NPN bipolar transistor, is formed on the semiconductor substrate 12 and has a base 26, collector 28 and emitter 30. The base 26 and emitter 30 are connected to the current sampling resistor 22 on either side as shown in FIG. 1, for sensing the voltage through the field effect transistor by means of the sampling resistor 22. The collector 28 of the parasitic bipolar transistor 24 is connected to the gate 20 of the field effect transistor 14.

A voltage dropping resistor 32 is also formed on the semiconductor substrate 12 and connected to the gate 20 of the field effect transistor 14. The voltage dropping resistor 32 is also formed by the techniques known to those skilled in the art including the technique used by forming low doped poly regions. A thermal limiting bipolar transistor 43 is also formed on the semiconductor substrate and includes a base 44, collector 46 and emitter 48. The thermal limiting bipolar transistor is formed by techniques known to those skilled in the art. The collector 46 is connected to the voltage dropping resistor 32 and the gate of the field effect transistor. The emitter 48 is collected to a ground terminal while the base 44 is connected to a voltage divider circuit as will be explained below.

A voltage divider circuit 34 is also formed on the semiconductor substrate 12 and is shown by the dashed outline in FIG. 1. The voltage divider circuit 34 is connected to the base 44 of the thermal limiting bipolar transistor 43 and receives a temperature stable reference voltage, such as from a temperature stable voltage source 36 that is located external to the semiconductor substrate. It is evident that when the thermal limiting bipolar transistor 43 switches on, the voltage dropping resistor 32 acts as an impedance. The bipolar transistor 43 drops the gate voltage as a direct action to limit the current in MOS 14 in order to thermally protect the device. On the other hand, the current limiting bipolar transistor 24 acts to sense overcurrent conditions. As current flows through the drain and covers a voltage drop across resistor 22, it turns on the current limiting bipolar transistor 24 and pulls the gate voltage of MOS 14 down.

Figure 3:
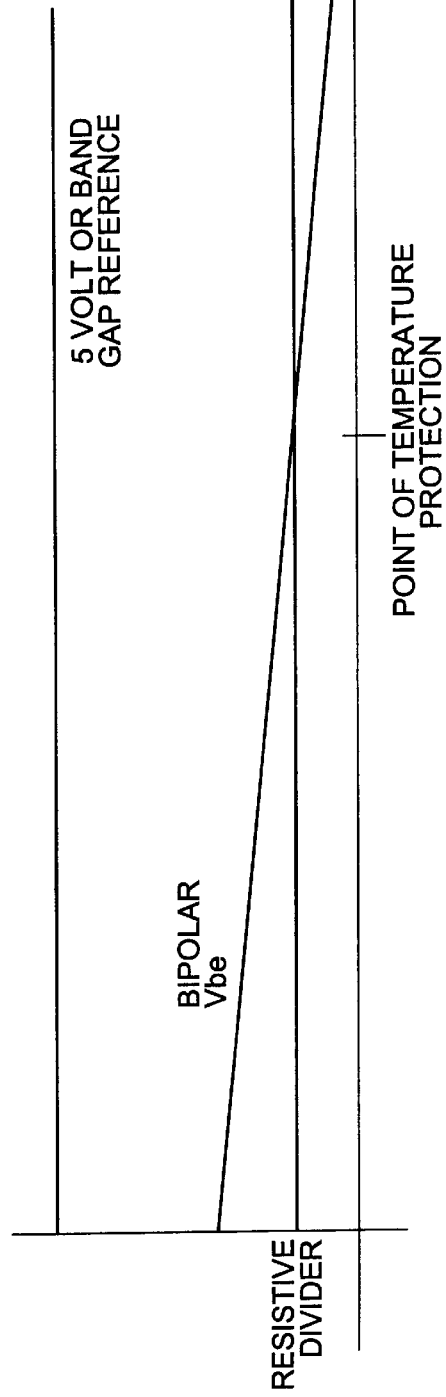
FIG. 3 is a graph showing how the Vbe of the thermal limiting bipolar transistor decreases to a point of temperature protection on the field effect transistor.

The external voltage source 36 acts as a power supply, which is temperature stable, and not formed monolithically as with the other components. This voltage divider circuit 34 divides the voltage down close to the Vbe of the parasitic bipolar transistor as shown on the graph of FIG. 3. As the temperature rises within the semiconductor substrate 12, and more particularly, in the field effect transistor 14, such as occurs in an electrical short or other overcurrent condition, the Vbe of the thermal limiting bipolar transistor 43 drops (FIG. 3). At a point labeled "Point of Temperature Protection" on the graph of FIG. 3, the parasitic thermal limiting bipolar transistor 43 switches on and drops the gate voltage, thus limiting any current passing through the field effect transistor 14.

In accordance with the illustrated embodiment of the present invention, the voltage divider circuit 34 can comprise two resistors 38,40 in series having a voltage divider output labeled at 42, and defined by the lower portion of the circuit 34. The resistors 38,40 can also be formed by those techniques known to those skilled in the art. The transistor 43, which is in the illustrated aspect of FIG. 1, comprises an NPN bipolar transistor, and is formed monolithically on the semiconductor substrate 12. As noted before, the transistor 43 is connected to the voltage divider output 42 and to the bipolar transistor 24. This bipolar transistor 43 includes a base 44, collector 46 and emitter 48.

The base 44 and emitter 48 of the bipolar transistor 43 are connected to the voltage divider output 42. The base 44 is connected directly to the upper output leg 42a between the two resistors 38,40, and the emitter 48 is connected to the grounded connection 42b. A protection diode 50 is also formed monolithically in the semiconductor substrate 12 by techniques known to those skilled in the art. The protection diode 50 acts as a voltage clamp. It normally would not have any current flowing through it. If the voltage rises too high, the protection diode 50 acts as a zener and clamps as a protection device.

The semiconductor substrate 12 is formed as a single monolithic chip and is contained within a semiconductor package shown by the solid perimeter line 52 of FIG. 1, which in one aspect of the invention, can be a five leaded semiconductor package such as commonly sold by Harris Corporation of Melbourne, Fla. under the trade designation T0220. In a prior art package that uses a bandgap reference on a chip, typically only three leads or pins could be used. It is evident that it is now necessary to have at least five pins as illustrated by the gate 54, drain 56, source 58, power 60 and ground pins 62 shown at the respective rectangular indices.

Figure 2:
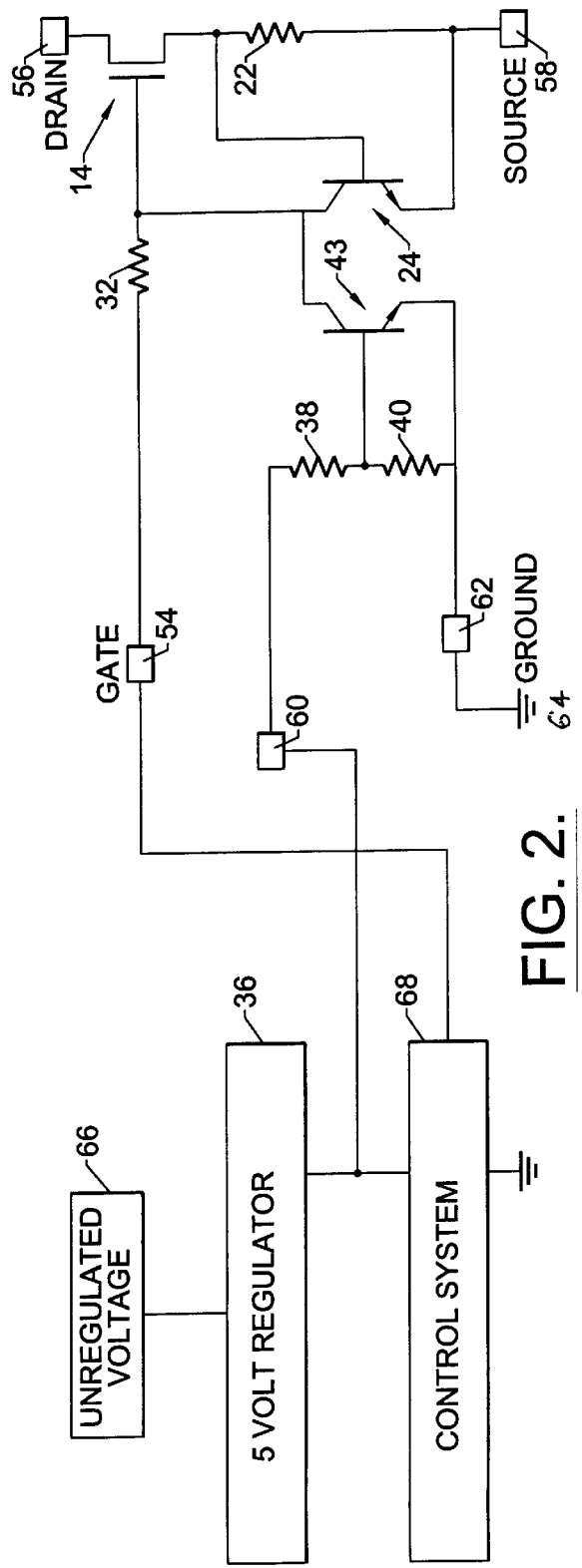
FIG. 2 is a schematic circuit diagram similar to the schematic circuit diagram of FIG. 1, and showing an external five volt regulator connected to a power pin and a control system connected to the gate of the field effect transistor.

As shown in FIG. 2, the ground pin 62 would connect directly to a ground source 64 while the power pin 60 would connect directly to the temperature stable reference voltage source 36, such as the illustrated five volt regulator, that could receive voltage from an unregulated voltage source 66 as is typical in many industrial applications, including automotive applications. The regulator could also be a three volt regulator as is common. There could be many different types of devices commonly used in an automobile application for switching applications. A control system 68 could also be connected directly to the gate pin 54 of the field effect transistor 14, as is well known to those skilled in the art.

FIG. 3 illustrates how the resistor 38,40 and bipolar transistor 43 values are chosen to allow the voltage divider circuit to reduce the voltage down to a point close to the Vbe turn on point. As the temperature increases, the bipolar Vbe is lowered and the parasitic bipolar transistor turns on. At that point, current is drawn off through the parasitic thermal limiting bipolar transistor 43, thus limiting the current passing through the field effect transistor 14.

Naturally, if the thermal limiting bipolar transistor 43 is formed to tolerate high voltages, the thermal shut down could work for the low side or high side configuration of an automobile, as is well known to those skilled in the art.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A thermally protected power device comprising:

a semiconductor substrate;

a field effect transistor formed on the semiconductor substrate and having a source, drain and gate;

a voltage dropping resistor formed on the semiconductor substrate and connected to the gate of the field effect transistor;

a thermal limiting bipolar transistor formed on the semiconductor substrate and having a base, collector and emitter, wherein the collector is connected to the voltage dropping resistor and gate of the field effect transistor; and a voltage divider circuit formed on the semiconductor substrate and having an output connected to the base of the thermal limiting bipolar transistor for receiving a temperature stable reference voltage from a temperature stable voltage source external to the semiconductor substrate and dividing the voltage down, wherein as the temperature rises within the semiconductor substrate, the Vbe of the thermal limiting bipolar transistor drops and switches on to pull the gate voltage down and limit current through the field effect transistor.

2. A thermally protected power device according to claim 1, wherein said thermal limiting bipolar transistor switches on and drops voltage across said voltage dropping resistor.

3. A thermally protected power device according to claim 1, wherein said voltage divider circuit comprises two resistors in series having a voltage divider output.

4. A thermally protected power device according to claim 1, and further comprising a current sampling resistor connected to the source of the field effect transistor and a current limiting bipolar transistor having a base and emitter connected to the current sampling resistor and a collector connected to the gate of the field effect transistor.

5. A thermally protected power device according to claim 1, wherein said voltage divider circuit further comprises a protection diode connected in parallel with the two resistors.

6. A thermally protected power device according to claim 1, wherein the temperature stable reference voltage is about five volts.

7. A thermally protected power device according to claim 1, wherein the temperature stable reference voltage is about three volts.

8. A thermally protected power device comprising:
a semiconductor substrate;
a field effect transistor formed on the semiconductor substrate and having a source, drain and gate;
a thermal limiting bipolar transistor formed on the semiconductor substrate and having a base, collector and emitter, wherein the collector is connected to the gate of the field effect transistor; and
a voltage divider circuit formed on the semiconductor substrate and connected to the base of the thermal limiting bipolar transistor for receiving a temperature stable reference voltage from a temperature stable voltage source external to the semiconductor substrate and dividing the voltage down, wherein as temperature rises within the semiconductor substrate, the Vbe of the thermal limiting bipolar transistor drops and switches on to pull the gate voltage down on the field effect transistor and limits current passing through the field effect transistor.

9. A thermally protected power device according to claim 8, and further comprising a voltage dropping resistor formed in the semiconductor substrate and connected to the gate of the field effect transistor.

10. A thermally protected power device according to claim 8, wherein said voltage divider circuit further comprises two resistors in series having a voltage divider output.

11. A thermally protected power device according to claim 8, and further comprising a current sampling resistor connected to the source of the field effect transistor and a current limiting bipolar transistor and a collector connected to the gate of the field effect transistor.

12. A thermally protected power device according to claim 8, wherein said voltage divider circuit further comprises a protection diode connected in parallel with the two resistors.

13. A thermally protected power device according to claim 8, wherein the temperature stable reference voltage is about five volts.

14. A thermally protected power device according to claim 8, wherein the temperature stable reference voltage is about three volts.

15. A thermally protected power device comprising:
a semiconductor package having five pins, one of said pins comprising a ground pin for connecting to a ground connection and another one of said five pins comprising a power pin for connecting to a source of a temperature stable reference voltage;
a field effect transistor formed within the semiconductor package and having a source, drain and gate connected to three of the pins and forming respective source, drain and gate pins;
a voltage dropping resistor formed within semiconductor package and connected to the gate of the field effect transistor;
a thermal limiting bipolar transistor formed within the semiconductor package and having a base, collector and emitter, wherein the collector is connected to the voltage dropping resistor and gate of the field effect transistor; and
a voltage divider circuit formed within semiconductor package and connected to the power pin, the ground pin and the base of the thermal limiting bipolar transistor for receiving a temperature stable reference voltage received from a temperature stable voltage source connected to the power pin and dividing the voltage down close to the Vbe of the thermal limiting bipolar transistor, wherein as the temperature rises within the semiconductor package, the Vbe of the thermal limiting bipolar transistor drops and switches on to pull the gate voltage down and limit the current passing through the field effect transistor.

16. A thermally protected power device according to claim 15, wherein said thermal limiting bipolar transistor switches on and drops voltage across said voltage dropping resistor.

17. A thermally protected power device according to claim 15, wherein said voltage divider circuit comprises two resistors in series having a voltage divider output.

18. A thermally protected power device according to claim 15, and further comprising a current sampling resistor connected to the source of the field effect transistor and a current limiting bipolar transistor having a base and emitter connected to the current sampling resistor and a collector connected to the gate of the field effect transistor.

19. A thermally protected power device according to claim 15, wherein said voltage divider circuit further comprises a protection diode connected in parallel with the two resistors.

20. A thermally protected power device according to claim 15, wherein the temperature stable reference voltage is about five volts.

21. A thermally protected power device according to claim 15, wherein the temperature stable reference voltage is about three volts.

22. A thermally protected power device comprising:
a semiconductor package having five pins, one of said pins comprising a ground pin for connecting to a ground connection and another one of said five pins comprising a power pin for connecting to a source of a temperature stable reference voltage;
a field effect transistor formed within the semiconductor package and having a source, drain and gate connected to three of the pins and forming respective source, drain and gate pins;
a thermal limiting bipolar transistor formed within the semiconductor package and having a base, collector and emitter, wherein the collector is connected to the gate of the field effect transistor; and
a voltage divider circuit formed within semiconductor package and connected to the power pin, the ground pin and the base of the thermal limiting bipolar transistor for receiving a temperature stable reference voltage obtained from a temperature stable voltage source connected to the power pin and dividing the voltage down close to the Vbe of the thermal limiting bipolar transistor, wherein as the temperature rises within the semiconductor package, the Vbe of the thermal limiting bipolar transistor drops and switches on to pull gate voltage down and limit current passing through the field effect transistor.

23. A thermally protected power device according to claim 22, and further comprising a voltage dropping resistor formed in the semiconductor substrate and connected to the gate of the field effect transistor.

24. A thermally protected power device according to claim 22, wherein said voltage divider circuit comprises two resistors in series having a voltage divider output.

25. A thermally protected power device according to claim 22, and further comprising a current sampling resistor connected to the source of the field effect transistor and a current limiting bipolar having a base and emitter connected to the current sampling resistor and a collector connected to the gate of the parasitic bipolar transistor.

26. A thermally protected power device according to claim 22, wherein said voltage divider circuit further comprises a protection diode connected in parallel with the two resistors.

27. A thermally protected power device according to claim 22, wherein the temperature stable reference voltage is about five volts.

28. A thermally protected power device according to claim 22, wherein the temperature stable reference voltage is about three volts.

29. A method of protecting a power switch from overcurrent conditions comprising the steps of:
forming a field effect transistor on a semiconductor substrate, and having a source, drain and gate;
forming a thermal limiting bipolar transistor on the substrate such that the collector is connected to the gate of the field effect transistor;
forming a voltage divider on the semiconductor substrate and having an output connected to the base of the thermal limiting bipolar transistor; and
supplying an external temperature stable voltage to the voltage divider circuit which is divided down such that when the temperature rises within the semiconductor substrate, the Vbe of the thermal limiting bipolar transistor drops and switches on to drop gate voltage and limit the current passing through the field effect transistor.

30. A method according to claim 29, and further comprising the step of forming the voltage divider circuit as two resistors in series having a voltage divider output.

31. A method according to claim 29, and further comprising the step of forming a current limiting bipolar transistor and current limiting resistor connected to the source of the field effect transistor.

32. A method according to claim 29, and further comprising the step of enclosing the semiconductor substrate within a semiconductor package, including a ground pin connected to the voltage divider circuit, a power pin connected to the voltage divider circuit, and respective source, drain and gate pins connected to the respective source, drain and gate of the field effect transistor.

* * * * *